United States Patent [19]

Tsai

[11] Patent Number: 5,161,021

[45] Date of Patent: Nov. 3, 1992

[54] WIRELESS VIDEO/AUDIO SIGNAL OR DATA TRANSMISSION DEVICE AND ITS REMOTE CONTROL CIRCUIT

[76] Inventor: Ching-Yun Tsai, 9-5 Fl., No. 230, Sec.2.Hsin I Road, Taipei, Taiwan

[21] Appl. No.: 629,671

[22] Filed: Dec. 18, 1990

[51] Int. Cl.$^5$ .................. H04N 5/40; H04N 5/455
[52] U.S. Cl. .................. 358/188; 358/186; 358/194.1; 340/310 A
[58] Field of Search ............. 358/191.1, 194.1, 188, 358/186; 340/310 A, 310 R

[56] References Cited

U.S. PATENT DOCUMENTS

| | | | |
|---|---|---|---|
| 4,174,517 | 11/1979 | Mandel | 340/310 A |
| 4,386,436 | 5/1983 | Kocher et al. | 340/310 A |
| 4,605,968 | 8/1986 | Hayashi | 358/188 |
| 4,670,789 | 6/1987 | Plume | 358/186 |
| 4,809,359 | 2/1989 | Dockery | 455/603 |
| 4,907,087 | 3/1990 | Schreiber | 358/186 |
| 4,916,532 | 4/1990 | Streck et al. | 358/83 |

OTHER PUBLICATIONS

"Pirate TV Station", DAK—Summer 1991 Catalog (Received Feb., 1991); Drew Kaplan.

Primary Examiner—James J. Groody
Assistant Examiner—Jeffrey S. Murrell

[57] ABSTRACT

A wireless video signal remote control system utilizes audio and video transmission at the FCC designated frequency of 902-928 MHz, but the carrier signals are AM modulated. Control signals are sent over a power line rather than using the wireless transmission antennas.

18 Claims, 5 Drawing Sheets

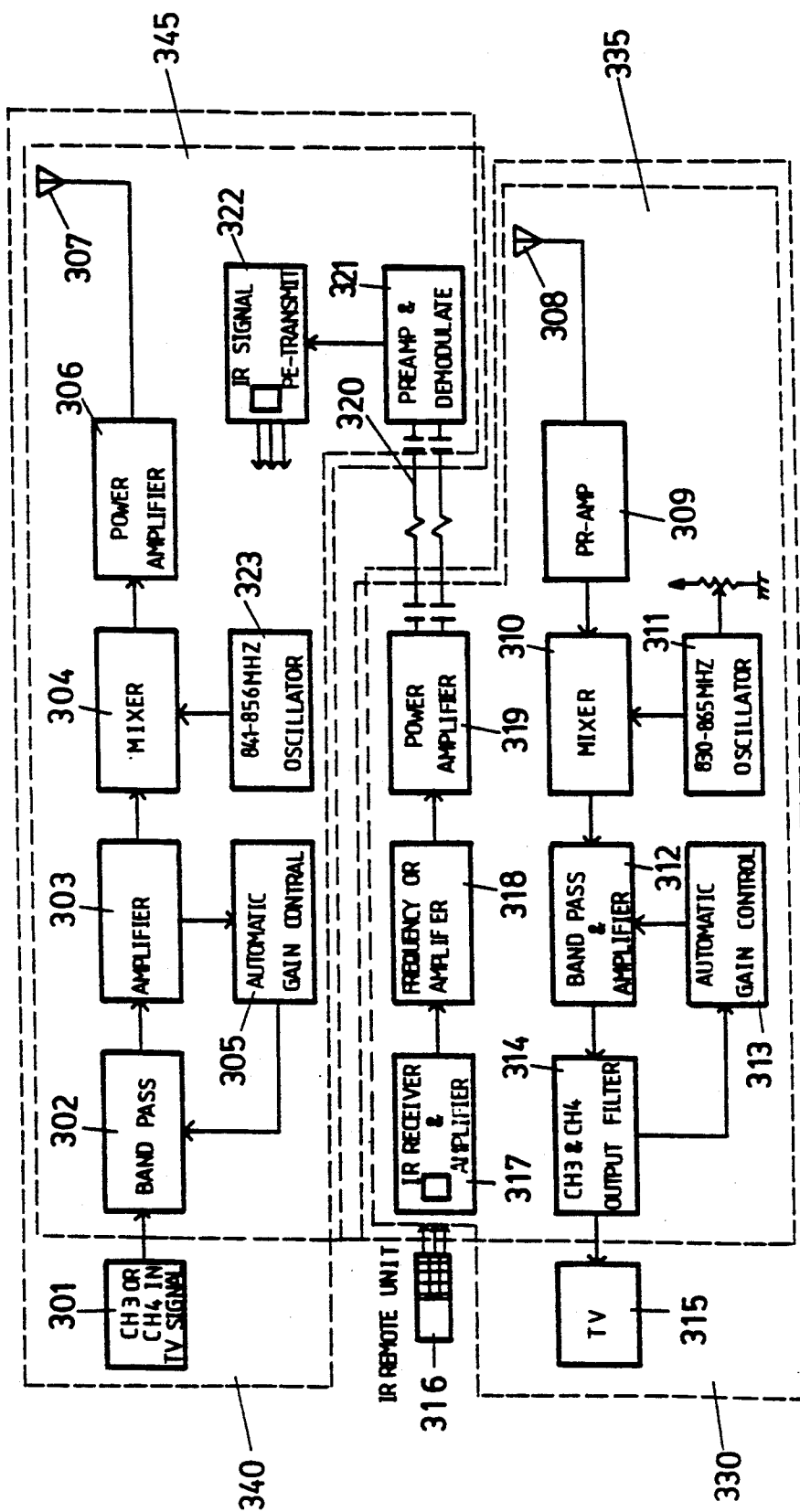
F I G. 5

WIRELESS VIDEO/AUDIO SIGNAL OR DATA TRANSMISSION DEVICE AND ITS REMOTE CONTROL CIRCUIT

BACKGROUND OF THE INVENTION

A variety of different wireless video signal remote control systems are known. The most advanced of these was disclosed in U.S. Pat. No. 4,916,532, with aspects of the system being disclosed in U.S. Pat. Nos. 4,739,413, 4,697,893, 4,694,338 et. al. The system is mainly characterized by transmission of signal close to the ordinary TV signal, and frequency modulation to 902-928 MHz to provide clear and sharp display quality. However, the known system has the following defects:

(1) Its structure is sophisticated, and its production cost is relatively high;

(2) Frequency modulation makes transmission of two or more signals impossible at Federal Communications Commissions designated frequencies of 902-928 MHz because the bandwidth of each FM channel is very wide, and hence it is not possible to transmit signals in two different channels within a zone. Consequently, a channel for the second floor will interfere with a different channel for the third floor.

(3) The frequencies of 909 MHz and 921 MHz as proposed by the U.S. Pat. No. 4,916,532 result in a frequency shift at 909 MHz frequency modulation. With a bandwidth of 12 MHz, i.e., 903-915 MHz, a width of 1 MHz is reserved for 927 Mhz frequency modulation, but the shift for normal frequency modulation is at least 2-4 MHz for the best modulation effect. Hence overlapping occurs at the upper band and the lower band and mutual interference happens. Indeed, the cited patent is only useful in a channel within 902-928 MHz;

(4) Remote control signals and video signals fall in the same bandwidth, and it is difficult to separate these signals;

(5) Under the current technology level, with a bandwidth of 6 MHz, the frequencies mentioned in item (3) do not allow transmission to two or more audio video equipments in the same area at the designated frequency of 902-928 MHz simultaneously.

In view of the above defects, the inventor has created a wireless video/audio signal or data transmission device and its remote control circuit which has the following advantages:

(1) Video signals are transmitted by AM at 902-928 MHz;

(2) Remote control signals are sent by power line at above 100 KHz and below 20 MHz to eliminate interference from the power line at lower than 100 KHz and to minimize interference;

(3) Remote control signals can be sent by either AM or FM, as desired by an individual client. A remote control signal is received by the video signal reception side. It is an infrared signal, which is detected and modulated (AM or FM) to 100 KHz-20 MHz, and then transmitted to the video signal transmitter side via a power line. The remote control signal is then demodulated (AM or FM), sent to the main control of the video signal transmitter side, or converted to an infrared signal to control its peripheral such as a TV, VCR, CATV converter, or other device which can be controlled by an infrared signal. Because the signal is modulated to the band of 100 KHz-20 MHz which can prevent interference, the present invention is different from that disclosed by U.S. Pat. No. 4,509,211, which detects a remote control infrared signal directly, sends the signal through a wire without modulation, and amplifies the signal to drive an IR diode directly. The present invention is also different from that disclosed by the U.S. Pat. No. 4,809,359 which applied radio signals for control of a device.

(4) There is a great difference in frequency between the video signal and the remote control signal and different media are used to carry these signals, hence interference is minimized, and the separate carriers lower production cost.

(5) The video signal is transmitted by AM, hence two or more channels can be used in the FCC band 902-928 MHz without mutual interference.

(6) There is an automatic gain control (AGC) to provide a stable and appropriate output to meet Federal Communication Commission requirements.

SUMMARY OF THE INVENTION

The present invention provides a wireless video/audio signal or data transmission device and a remote control circuit which sends a video signal from a transmitter via an antenna at 902-928 MHz, and receives the signal by a receiver via a receiving antenna to display the signal/image using a TV set or data processor. It uses an external infrared remote control signal, which is detected and modulated (AM or FM) to transmit the internal remote control signal through a power line. The internal remote control signal is, after demodulation (AM or FM), applied to control the video transmitter or a video signal source, or is retransmitted in the form of an infrared wave to control the video signal source device and a device located at the video transmitter area. The present invention is hence simple in structure with minimum interference for control of two or more channels.

BRIEF DESCRIPTION OF THE DRAWINGS

FIG. 5 is a block diagram of the fifth embodiment according to the present invention.

DETAILED DESCRIPTION OF THE PREFERRED EMBODIMENTS

Figure 1:
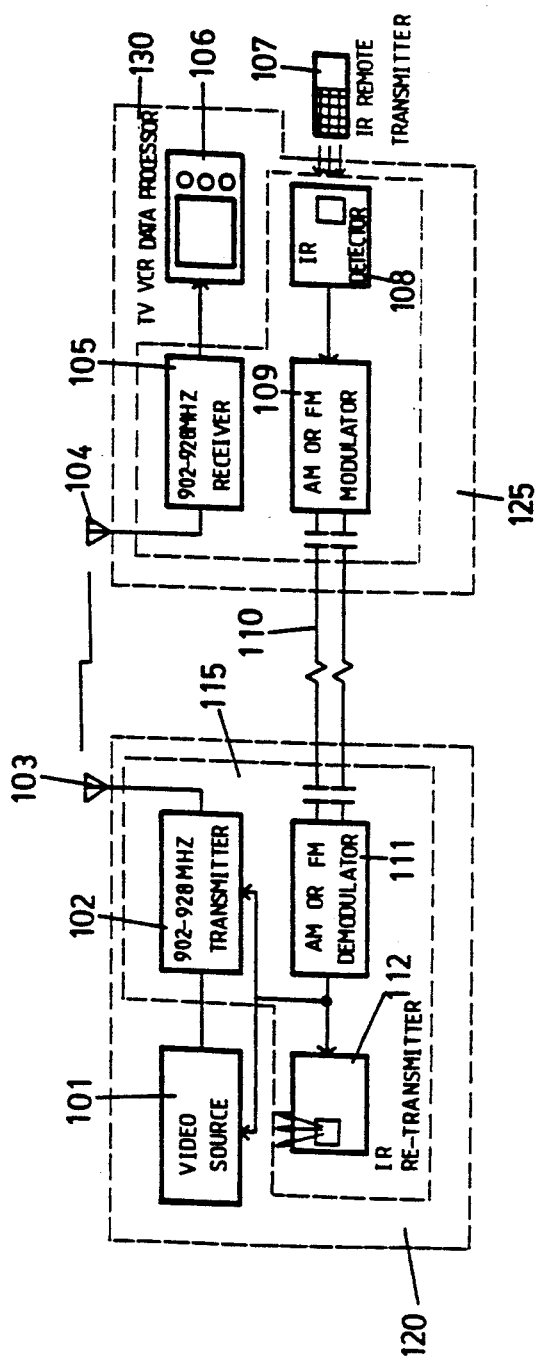
FIG. 1 is a block diagram of the first embodiment according to the present invention.

According to the present invention, as shown in FIG. 1, the video source (101) is modulated and transmitted by a transmitter (102) through a transmitting antenna at 902-928 MHz, and then received by a receiver (105) through a receiving antenna (104) to transmit to a TV set (106) for video display. For controlling of the video source (101), a remote controlled transmitter (107) sends an external infrared control signal, which is then detected by a infrared detector (108) modulated by an AM or FM modulator (109), to generate an internal remote control signal, which is then transmitted to an AM or FM demodulator (111) located at the video transmitter side (102) through power line (110). The demodulator (111) sends instructions to the video transmitter itself or the video source (101) directly or through an infrared re-transmitter (112), and the infrared control signal is applied to control a VCR, CATV converter or other device to change the video source, terminate the video source, or turn off the power source.

The above mentioned video source (101), transmitter (102), AM or FM demodulator (111) and the infrared transmitter (112) the latter three being collectively designated by reference numeral 115 can be integrated to become a single unit, (120) and the video signal receiver (105), AM or FM modulator (109), infrared detector (108), collectively designated by reference numeral 125, and the TV set can be combined to become another unit (130) so that TV sets, or computers, or monitors, or other peripherals in different rooms or floors can be controlled by the infrared transmitter (107), or the infrared to be retransmitted back to control the video source and the device surrounded the video source device.

Figure 2:
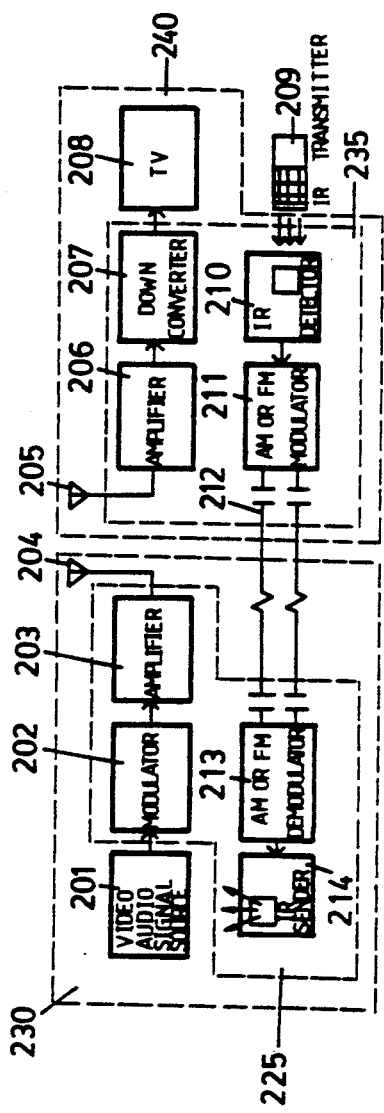
FIG. 2 is a block diagram of the second embodiment according to the present invention.

FIG. 2 shows an embodiment of the invention which provides for transmission and control of a video signal. The video signal, with audio signal from the video source (201) is modulated by a modulator (202), amplified by an amplifier (203), and then transmitted via a transmitter antenna (204) at 902-928 MHz. The signal is then received by a receiver antenna (205) and amplified by an amplifier (206), and then has its frequency lowered by a down converter (207) to that receivable by a TV set for display on the TV set. For remote control, the infrared transmitter (209) sends a control signal, which is detected by a infrared detector (210), modulated by an AM or FM modulator (211), transmitted via a power line to an AM or FM demodulator (213), and then transmitted by an infrared transmitter (214) to control the video and audio signal source (201). The above mentioned modulator (202), amplifier (203), antenna (204), demodulator (213) and infrared transmitter (214), collectively forming a transmission unit (225), can be incorporated with the signal source (201) to become a single unit (230). The antenna (205), amplifier (206), down converter (207), modulator (211) and infrared detector (210) collectively forming a reception unit (235), can be incorporated with the TV set to become a single unit (240).

Figure 3:
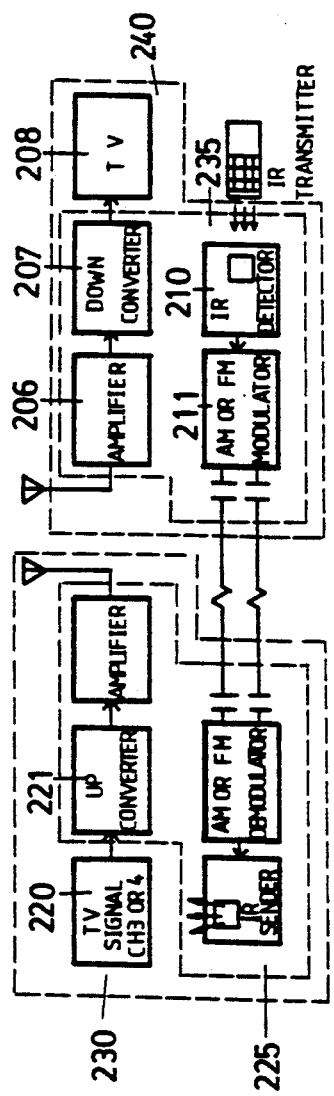
FIG. 3 is a block diagram of the third embodiment according to the present invention.

Refer to FIG. 3 for another embodiment of the present invention which is similar to that shown in FIG. 2 except that the video input signal channel 3 or channel 4 (220) is designed to raise the signal frequency to 902-928 MHz directly by means of a converter (221). As described above, converter (221), amplifier (203), antenna (204), demodulator (213) and infrared transmitter (214) constitute transmission equipment (225) and can be incorporated with the signal source (220) to become a single unit (230). The reception side (240) is the same as that shown in FIG. 2, which can have two different configuration.

Figure 4:
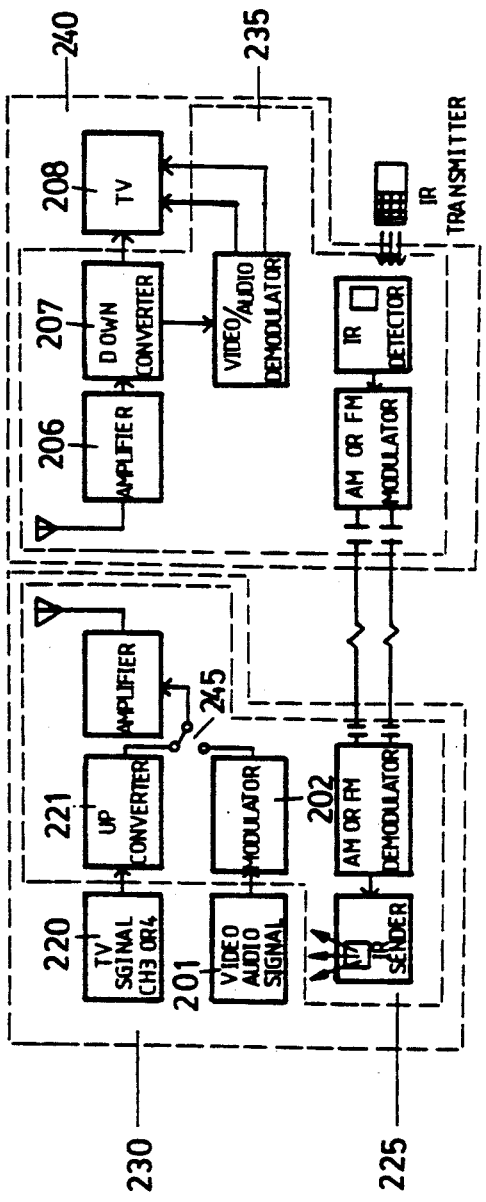
FIG. 4 is a block diagram of the fourth embodiment according to the present invention.

FIG. 4 is a combination of FIGS. 2 and 3. The transmission side (225) includes a selector switch (245) to select between either TV channels 3 or 4, a video and audio signal. Side (225) also includes a converter (221), amplifier (203), modulator (202) and infrared transmitter (214). The reception side (235) is the same as that shown in FIGS. 2 and 3, except for the addition of a video/audio demodulator (250) connected between down converter (207) and TV (208) for demodulation of signals originating from source (201).

As shown in FIG. 5, the TV signal in channel 3 or 4 (301) is filtered by a filter (302), amplified by an amplifier (303), and then mixed by a mixer (304). The amplifier (303) is incorporated with an automatic gain control (305) to control output from the filter (302). An oscillator (323) is applied to generate an adjustable frequency at 841-856 MHz so that the mixer generates and gives the power amplifier (306) a signal at 902-928 MHz, which is transmitted via an antenna (307). A signal received by the receiving antenna (308) is amplified by an amplifier (309) and then delivered to a mixer (310). The mixer (310) is incorporated with an oscillator (311) to generate an adjustable frequency at 830-865 MHz to form an IF signal to a filter and amplifier (312) to filter out noise and then amplify the signal. The signal output from channel 3 or 4 is finally displayed at the TV set (315). The present invention has an automatic gain control (313) to control the magnitude of the signal from filter (312) and amplifier (314). Elements (308)-(314) and (317)-(319) collectively form a reception unit (335), which together with TV (315) may be referred to as the reception side of the preferred system.

The remote infrared controller (316) according to the present invention is arranged to control the infrared receiver and detector (317) at the reception side (330). After modulation at an AM or FM modulator (318), and amplification by an amplifier (319), the control signal is transmitted via power line (320) to the transmission side (345), which includes transmission unit (340). The control signal is then demodulated by a demodulator (322) at the transmission side, and sent out by the infrared transmitter (321) to a CATV channel selector, VCR, or other video input device.

Figure 6:
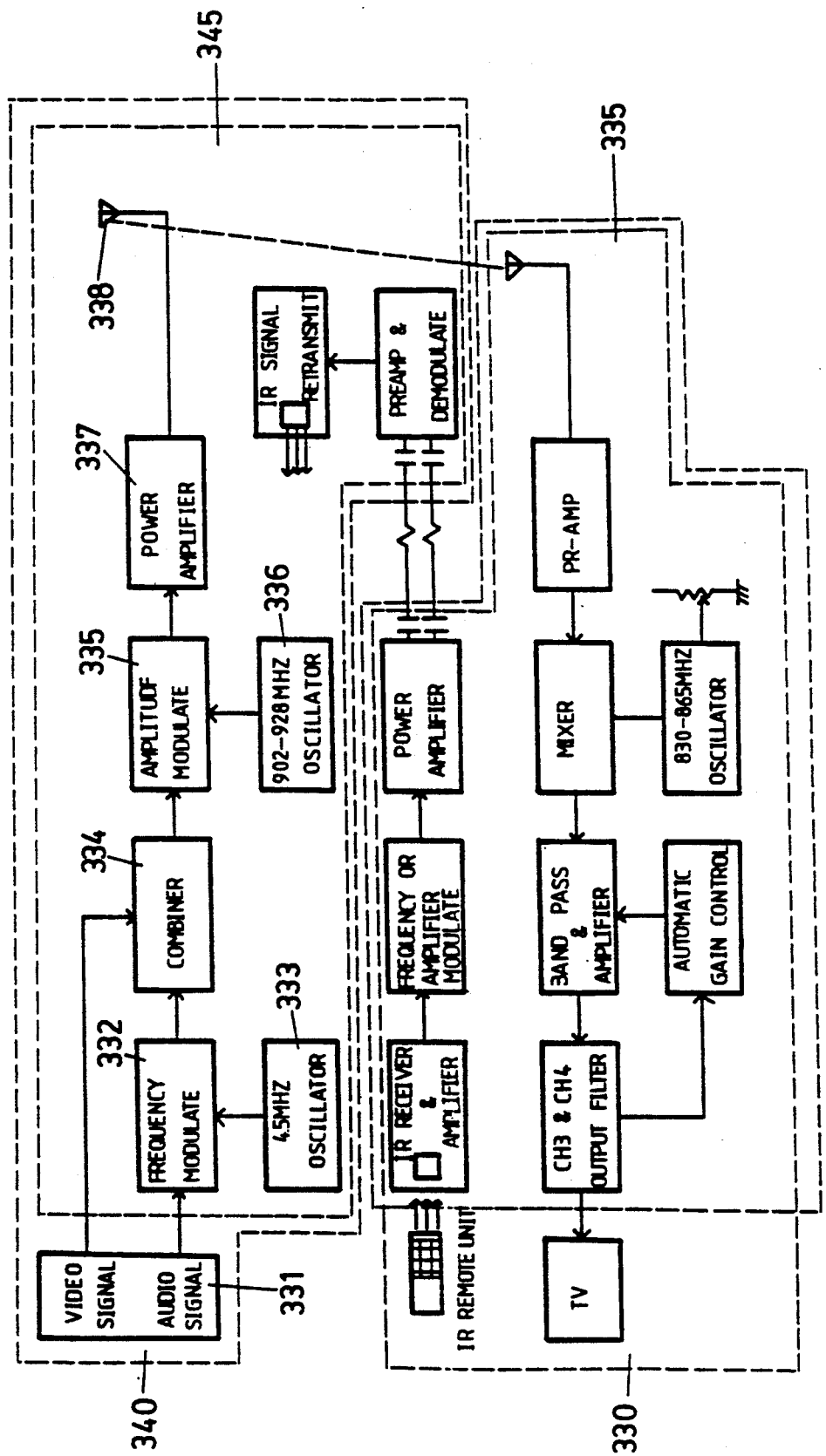
FIG. 6 is a block diagram of the sixth embodiment according to the present invention.

The embodiment shown in FIG. 6 is substantially the same as that shown in FIGS. 5 and 6, except that the video signal is either from A CATV converter of a VCR video or audio signal source (331), in which the audio signal is modulated by a modulator (332), which is incorporated with an oscillator (333) to oscillate and give the FM modulator (332) a frequency at 4.5 MHz, and cause the modulated signal to combine with the video signal at a combiner (334). The combined signal is then modulated at an AM modulator (335), which is incorporated with an oscillator (336) to provide an adjustable frequency at 902-928 MHz, and then transmitted by a power amplifier (337) via an antenna (338). The reception side (330) is the same as that shown in FIG. 5.

Figure 7:
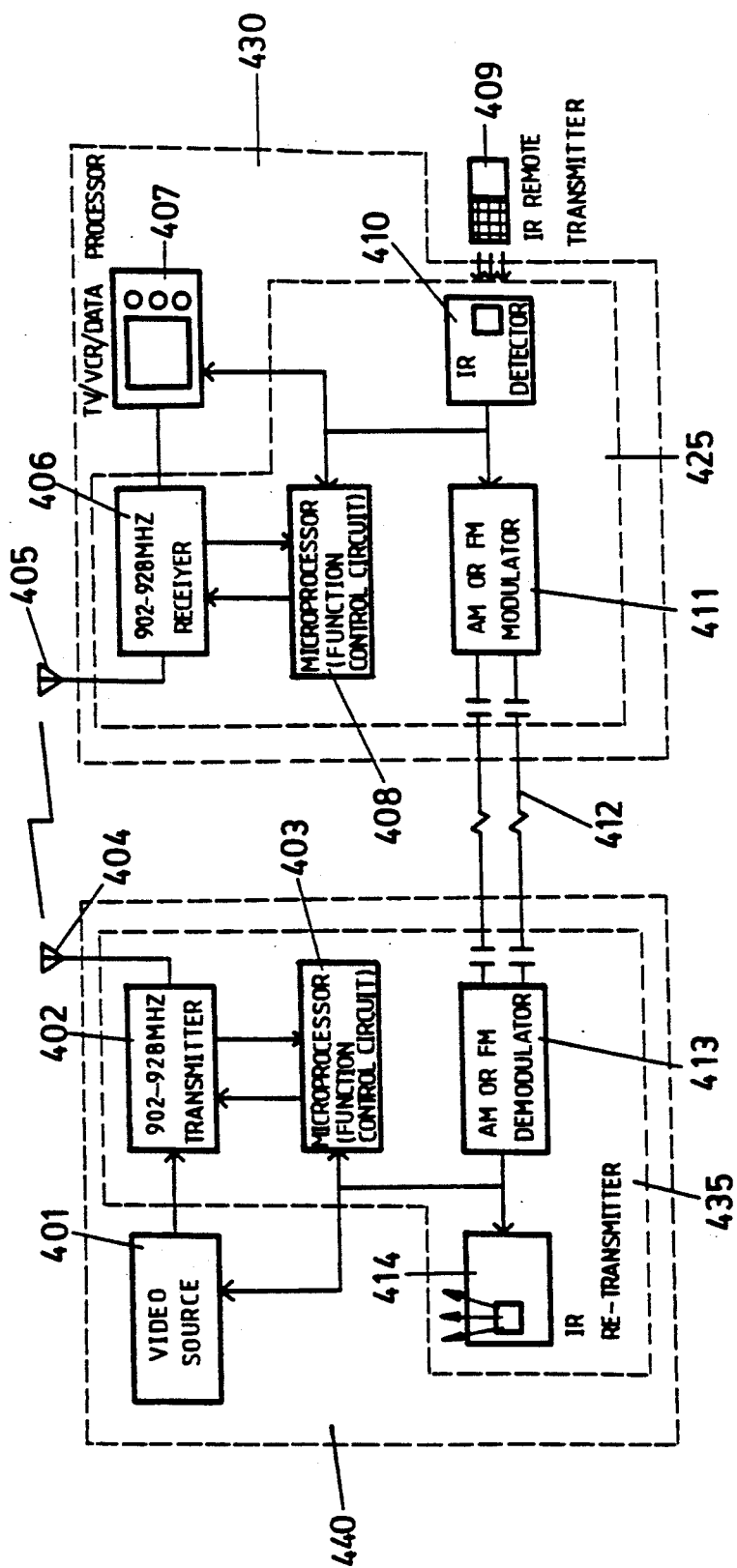
FIG. 7 is a block diagram of the seventh embodiment according to the present invention.

FIG. 7 shows another embodiment of the present invention, in which the video signal source (401) at the transmission side (440), including transmission unit (435) and video source (401) is modulated and sent to a 902-928 MHz transmitter (402) controlled by a functional control circuit (403). The functional control circuit (403) can be controlled by an a control panel, or by a IR remote controller at the reception side via a power line after demodulation by a demodulator (413). The functional control circuit (403) is designed to control frequency, a power switch, or a control video signal source by IR remote control.

The 902-928 MHz signal is received by the receiver (406) at the reception side (430), including unit (425), via an antenna (405), a signal from the receiver (406) causing a TV set (407) to display a video/audio signal. A signal from the infrared transmitter (409) according to the present invention is detected by an infrared detector (410) and then controls the functional control circuit (408) or a TV set (407) directly. Simultaneously, the remote control signal is detected by the infrared detector (410), modulated by an AM/FM modulator (411), amplified and sent to the video signal transmitters via a power line (412). The signal is then demodulated by an AM/FM demodulator (413) to control the functional control circuit (403) in the video signal transmitter directly, or transmitted by a re-transmitter (414) to control the video signal source (401).

The present invention can be designed to incorporate the receiver (406), TV set (407), functional control circuit (408), AM/FM modulator (411), and infrared detector (410) a single unit (430), and the video source (401), transmitter (402), functional control circuit (403), AM/FM demodulator (413), and infrared re-transmitter (414) as another single unit (440).

The present invention is mainly characterized by the transmission of video signals by a transmitter via an antenna at 902-928 MHz, and the transmission of remote control signals via a power line. Because the two signals are transmitted separately, the interference between them is minimized. Moreover, AM or FM modulation is done at over 100 KHz and lower than 20 MHz to overcome the biggest interference at lower than 100 KHz. If AM transmission is interfered with, FM may be elected for transmission of the remote control signals. Such a design makes available two different choices.

Ultrasonic wave or microwaves may also be applied instead of infrared wave in the transmission and reception of remote control signals in variations of the embodiment shown in FIGS. 1-7. Numerous other variations are of course also possible within the scope of the invention, and thus it is intended that the invention be limited by the appended claims rather than to any of the exemplary embodiments described above.

I claim:

1. A wireless signal or data transmission device and a remote control circuit therefor, comprising:
    transmission means including a video signal source and a video transmitter for modulating and transmitting a video signal via an antenna at a frequency of 902-928 MHz;
    reception means for receiving the video signal at a frequency of 902-928 MHz, said reception means including a video receiver, means for demodulating the video signal, and means for displaying the video signal on a television set;
    internal remote control signal generation means including an infrared detector for picking up and detecting external infrared remote control signals, said remote control signal generation means for including means for slectively amplitude or frequency modulating the internal remote control signals, and means for sending the signals over a power line; and
    internal remote control signal reception means for receiving the internal remote control signals carried by the power line, demodulating the internal remote control signals, and applying the demodulated internal remote control signals to control said video transmitter.

2. A transmission device as claimed in claim 1, further comprising an audio signal source, means including a mudulator for modulating video and audio signal to 902-928 MHz, and measn including a power amplifier for amplifying the modulated signal for transmission via said antenna.

3. A transmission device as claimed in claim 1, further comprising means including a TV signal channel 3 or 4 converter for converting channel 3 or 4 signals to 902-928 MHz and transmitting the converted channel 3 of 4 signals via said antenna.

4. A transmission device as claimed in claim 1, wherein said video transmitter includes means comprising a channel 3 or 4 converter for converting channel 3 or 4 signals 902-928 MHz, and means for amplifying the converted channel 3 or 4 signals for transmission via said antenna.

5. A transmission device as claimed in claim 1, further comprising means for directly controlling the video receiver in response to said external infrared remote control signal.

6. A transmission device as claimed in claim 1, wherein said transmission means includes means for modulating an audio signal to an intermediate frequency, means for mixing the audio signal with the video signal, means for modulating the mixed signal to 902-928 MHz, means for amplifying the modulated mixed signal, and means including said antenna for transmitting the amplified signal.

7. A transmission device as claimed in claim 1, wherein said transmission means comprises means for inputting a video signal at TV signal channel 3 or 4, means for filtering the channel 3 or 4 video signal, means for amplifying the channel 3 or 4 video signal, means for controlling the amplified video signal by automatic gain control, means for mixing the controlled video signal, and means for oscillating the mixed video signal to 902-928 MHz for transmission via an amplifier and said antenna.

8. A transmission device as claimed in claim 1, wherein said reception means and said internal remote control signal generation means form a single integrated transmission unit.

9. A transmission device as claimed in claim 1, wherein said transmission means includes means for amplitude modulating said video signal.

10. A wireless signal or data transmission device and a remote control circuit therefor, comprising:
    transmission means including a video signal source and a video transmitter for modulating and transmitting a video signal via an antenna at a frequency of 902-928 MHz;
    reception means for receiving the video signal at a frequency of 902-928 MHz, said reception means including a video receiver, means for demodulating the video signal, and means for displaying the video signal on a television set;
    internal remote control signal generation means including an infrared detector for picking up and detecting external infrared remote control signals, said remote control signal generation means including means for selectively amplitude or frequency modulating the internal remote control signals, and means for sending the signals over a power line; and
    internal remote control signal reception means for receiving the internal remote control signals carried by the power line, demodulating the internal remote control signals, and retransmitting the control signals via an infrared transmitter to control the video signal source.

11. A transmission device as claimed in claim 10, further comprising an audio signal source, means including a modulator for modulating video and audio signal to 902–928 MHz, and means including a power amplifier for amplifying the modulated signal for transmission via said antenna.

12. A transmission device as claimed in claim 11, further comprising means including a TV signal channel 3 or 4 converter for converting channel 3 or 4 signals to 902–928 MHz and transmitting the converted channel 3 or 4 signals via said antenna.

13. A transmission device as claimed in claim 10, wherein said video transmitter includes means comprising a channel 3 or 4 converter for converting channel 3 or 4 signals 902–928 MHz, and means for amplifying the converted channel 3 and 4 signals for transmission via said antenna.

14. A transmission device as claimed in claim 10, further comprising means for directly controlling the video receiver in response to said external infrared remote control signal.

15. A transmission device as claimed in claim 10, wherein said transmission means includes means for modulating an audio signal to an intermediate frequency, means for mixing the audio signal with the video signal, means for modulating the mixed signal to 902–928 MHz, means for amplifying the modulated mixed signal, and means including said antenna for transmitting the amplified signal.

16. A transmission device as claimed in claim 10, wherein said transmission means comprises means for inputting a video signal at TV signal channel 3 or 4, means for filtering the channel 3 or 4 video signal, means for amplifying the channel 3 or 4 video signal, means for controlling the amplified video signal by automatic gain control, means for mixing the controlled video signal, and means for oscillating the mixed video signal to 902–928 MHz for transmission via an amplifier and said antenna.

17. A transmission device as claimed in claim 10, wherein said reception means and said internal remote control signal generation means form a single integrated transmission unit.

18. A transmission device as claimed in claim 10, wherein said transmission means includes means for amplitude modulating said video signal.

* * * * *